United States Patent [19]

Pfleiderer et al.

[11] Patent Number: 4,517,672

[45] Date of Patent: May 14, 1985

[54] METHOD AND ARRANGEMENT FOR AN OPERATIONAL CHECK OF A PROGRAMMABLE LOGIC ARRAY

[75] Inventors: Hans-Joerg Pfleiderer; Gerhard Grassl, both of Zorneding, Fed. Rep. of Germany

[73] Assignee: Siemens Aktiengesellschaft, Berlin & Munich, Fed. Rep. of Germany

[21] Appl. No.: 401,229

[22] Filed: Jul. 23, 1982

[30] Foreign Application Priority Data

Sep. 7, 1981 [DE] Fed. Rep. of Germany ....... 3135368

[51] Int. Cl.$^3$ ............................................ G06F 11/00
[52] U.S. Cl. .......................................... 371/27; 371/25
[58] Field of Search ........................ 371/21, 25, 26, 27

[56] References Cited

U.S. PATENT DOCUMENTS

| | | | |
|---|---|---|---|
| 4,041,459 | 8/1977 | Horninger | 340/166 R |
| 4,216,374 | 8/1980 | Lam et al. | 371/27 |
| 4,435,805 | 3/1984 | Hsieh et al. | 371/25 |

OTHER PUBLICATIONS

W. W. Wu, Pretesting Laserable PLA Peripheral Circuits, IBM Technical Disclosure Bulletin, vol. 22 #5, p. 1866, 10/79.

A. E. Ruehli, Test Generation Procedures for Delay Testing Dynamic Logic PLA's, IBM Technical Disclosure Bulletin, vol. 21 #5, p. 2097, 10/78.

C. W. Cha, Prime Faults in a Double-Bit Partition PLA, IBM Technical Disclosure Bulletin, vol. 18, No. 8, 1/76, p. 2715.

Williams T. W. et al., "Random Patterns Within a Structured Sequential Logic Design", Digest of Papers, 1977 Semiconductor Test Symposium, pp. 19-27.

Primary Examiner—Jerry Smith
Assistant Examiner—M. Ungerman
Attorney, Agent, or Firm—Hill, Van Santen, Steadman & Simpson

[57] ABSTRACT

A function check of a programmable logic array is performed in which input lines, product term lines and ground lines are combined into an AND plane and output lines, product term lines and ground lines are combined into an OR plane. The aim is a simple method of function check which permits any potentially-existing fault to be detected. The check is achieved by generating, with a test data generator, bit patterns and applying the same to the input lines, and, through the use of a shift register, successively sensitizing the product term lines either individually or in groups, i.e. disconnecting the same from ground potential. The bit patterns occurring at the output lines are supplied to a test data evaluator. The area of use is in logic circuitry of data processing technology.

11 Claims, 6 Drawing Figures

METHOD AND ARRANGEMENT FOR AN OPERATIONAL CHECK OF A PROGRAMMABLE LOGIC ARRAY

BACKGROUND OF THE INVENTION

1. Field of the Invention

The present invention relates to a method for the operational check of a programmable logic array in which input lines, intersecting product term lines and ground lines are combined into an AND plane, in which the product term lines, in addition, are combined with intersecting output lines and ground lines into an OR plane, and in which switching transistors are provided at selected points of intersection of both planes, whereby, first, a sequence of bit patterns is applied to the input lines and, as a function of the switching transistor disposed in at least one plane, output bit patterns are derived over the output lines, which output patterns are investigated as to deviation from a reference result.

2. Description of the Prior Art

A programmable logic array (PLA) of the type set forth above can be derived, for example, from the German Letters Pat. No. 25 19 078, which corresponds to U.S. Pat. No. 4,041,459, which is fully incorporated herein by this reference. As can be determined from the article of T. W. Williams and E. B. Eichelberger entitled "Random Patterns Within A Structured Sequential Logic Design", Digest of Papers, 1977 Semiconductor Test Symposium, pp. 19–27, particularly pp. 24 and 25 and FIG. 9, also fully incorporated herein by this reference, an operational check of a PLA is executed in such a manner that a multitude of bit patterns are applied to its inputs and the output bit patterns occurring at the outputs are evaluated in terms of potential deviations from reference patterns. However, given the use of pseudo-random patterns which can be generated by simple test data generators, the disadvantage occurs that, given larger PLA's with numerous inputs and outputs, only approximately 60% of the possibly existing circuit faults can be detected given the use of approximately 1,000 bit patterns. In order to detect all faults, a test data generator is required which, as a function of the PLA circuit to be tested, emits specially selected bit patterns. Thereby, however, the selection of the bit patterns is involved and time consuming and the test data generators required for this purpose are very complex.

SUMMARY OF THE INVENTION

The object of the present invention is to provide a simple method and apparatus with which a PLA can be completely checked as to its operational ability.

The foregoing object is achieved in a method and apparatus of the type set forth above, in that the input lines are individually and successively seized with a logic "1", whereas all other input lines have a logic "0" applied thereto, in that the product term lines are individually or group-wise disconnected in succession from ground, whereas the remaining product term lines or, respectively, the remaining groups of such lines are maintained at ground, and in that the bit patterns occurring at the output lines are supplied to a test data evaluator.

The advantage which may be obtained by practicing the present invention is that each individual transistor of the PLA is monitored as to its functionability. In addition, the method can be realized by simple circuits with small space requirements, so that an automatic check of the circuit is effectively possible.

According to a particular feature of the invention, an additional step is provided in that a logic "0" is supplied to all input lines for evaluation.

BRIEF DESCRIPTION OF THE DRAWINGS

Other objects, features and advantages of the invention, its organization, construction and mode of operation will be best understood from the following detailed description, taken in conjunction with the accompanying drawings, on which.

DESCRIPTION OF THE PREFERRED EMBODIMENTS

Figure 1:
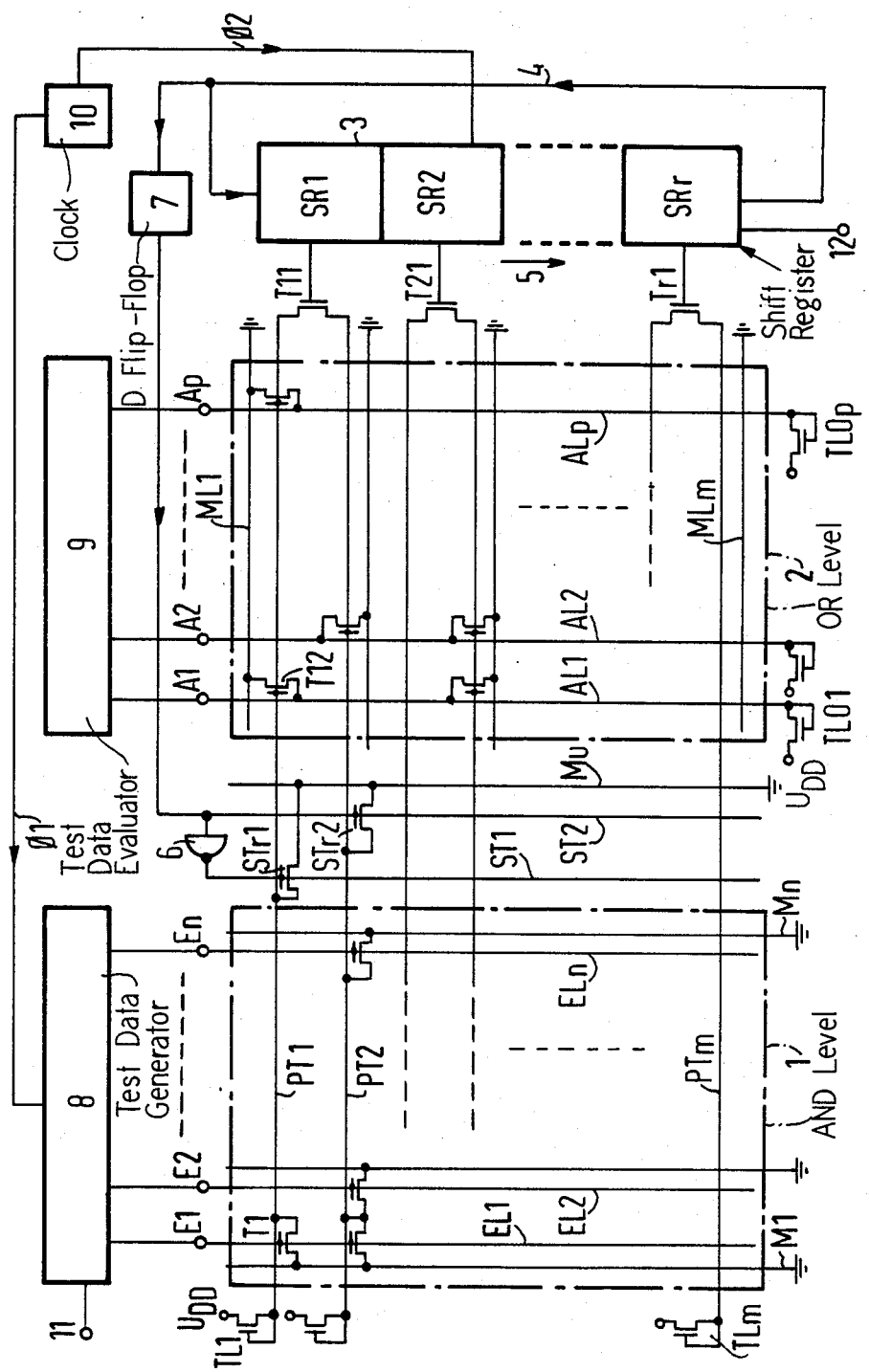
FIG. 1 is a schematic diagram of a circuit arrangement for implementing the method of the invention.

A PLA is illustrated in FIG. 1, its AND plane being referenced 1 and its OR plane being referenced 2. A plurality of inputs E1–En are connected to vertical input lines EL1–ELn of the AND level, next to which ground lines M1–Mn are disposed. Horizontal output lines PT1–PTm are also referred to as product term lines. A field effect switching transistor, for example, the transistor T1 can be provided at each point of intersection of an input line and a product term line, the gate of the field effect switching transistor being connected to the appertaining input line, for example, the input line EL1, and its source-drain switching segment being connected between the assigned ground line, for example, the ground line M1, and the product term line, for example, the product term line PT1, located at the point of intersection. The points of intersection of the lines EL2 and PT1 and of the lines ELn and PT1 are not occupied with switching transistors according to FIG. 1.

The product term lines PT1–PTn are respectively provided at their left end with a transistor TL1–TLm connected as a load element whose gate is connected to its source terminal and whose drain terminal is connected to the supply voltage $U_{DD}$. The lines PT1–PTm simultaneously represent the input lines for the OR plane 2 and are connected in pairs to one another at their right ends via respective switching transistors T11–Tr1. The gates of the transistors T11–Tr1 are connected at the outputs of the individual stages of a shift register 3 which is back-coupled via a line 4. The shift direction is indicated by an arrow 5. In the OR plane 2, ground lines ML1–MLm are provided next to the lines PT1–PTm, whereas a plurality of output lines AL1–ALp extend in the vertical direction and essentially become output lines of the PLA which are referenced A1–Ap. Switching transistors, for example the transistor T12, can be provided at the points of intersection of the product term lines, for example, the product term line PT1, and the output lines, for example, the output line AL1, the gates of the switching transistors then being connected to the appertaining horizontal line, for example, the product term line PT1, and the source-drain switching segments being connected between the respective ground line, for example, the ground line ML1, and the output line, for example, the output line AL1. No switching transistor is provided, for example, at the point of intersection of the line PT1 and the line AL2. The lower ends (as viewed on the drawing) of the output lines AL1–ALp are connected to transistors TL01–TL0p connected as load elements whose gates are connected to their respective source terminals and whose drain terminals are connected to the supply voltage $U_{DD}$.

Circuit portions of a selection circuit are provided between the planes 1 and 2, such portions comprising, in particular, a ground line Mu, two control lines ST1 and ST2 and a series of switching transistors, for example, the switching transistor STr1, which respectively lie at the points of intersections of the lines PT1, PT3, etc, and the line ST1, as well as the points of intersection of the lines PT2, PT4, etc, and the line ST2. The gates of these transistors are connected to the respective control line, whereas their source-drain switching segments connect the ground line Mu to the appertaining product term line PT1–PTm. The control lines ST1 is connected via an inverter 6 and the control line ST2 is directly connected to the output of a D flip-flop 7. The input of the flip-flop 7 is connected to the feedback line 4.

The inputs E1–En of the PLA are connected to corresponding outputs of a test data generator 8, whereas the outputs A1–Ap are connected to the inputs of a test data evaluator 9. A clock 10 supplies clock pulses $\emptyset 1$ to the test generator 8 and clock pulses $\emptyset 2$ to the shift register 3.

Figure 2:
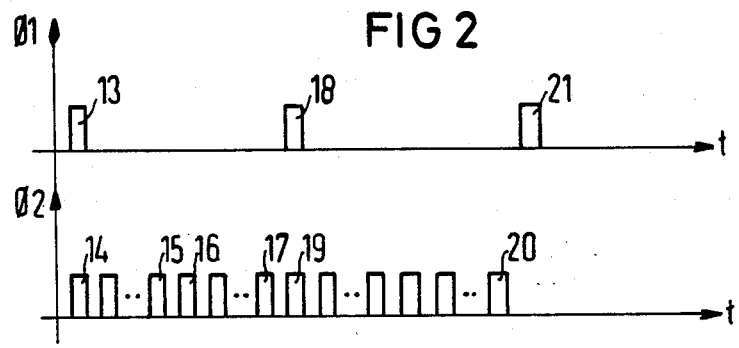
FIG. 2 is a graphic illustration, shown in the form of voltage/time diagrams to aid in the explanation of FIG. 1.

At the beginning of a check operation, the test data generator is set via a reset input 11 in such a manner that, given the occurrence of a clock pulse 13 of $\emptyset 1$ (FIG. 2), a logic "0" is applied to all inputs E1–En. Simultaneously, the shift register 3 is set via a reset input 12 in such a manner that, given the occurrence of a clock pulse 14 of $\emptyset 2$ (FIG. 2), a logic "0" is provided at the output of the first shift register stage SR1, but a respective logic "1" is available at the outputs of all other shift register stages SR2 . . . SRr. A logic "1" is provided at the output of the D flip-flop 7 and a logic "0" is at the output of the inverter 6. Therefore, the transistor T11 is blocked, the line PT2 lies at ground via the transistor STr2 and the line PT1 is sensitized, i.e., is the only product term line which is not applied to ground in the area of the OR plane 2. The latter condition applies because all other product term lines are either applied directly to ground via the input and output of the inverter 6 or a control transistor which is conductive or are connected to the respective other product term line of the pair via the conductive transistors T21 . . . Tr1 and, therefore, are indirectly connected to ground. As a result of the bit pattern 00 . . . 0 at the inputs E1–En, the product term line PT1 remains at a logic "1", so that a logic "1" occurs at each of the outputs A1–Ap when a switching transistor is not located at the point of intersection of the output line leading thereto and the product term line PT1. When such a switching transistor exists, then the appertaining output emits a logic "0". As a result of the further clock pulses of $\emptyset 2$ up to and including the clock pulse 15, other outputs of the shift register 3 successively provide a logic "0", so that the third, fifth, etc., product term line is sensitized. The clock pulse 16 of $\emptyset 2$ then provides a logic "0" to the input of the flip-flop 7, so that the signals on the control lines ST1 and ST2 are mutually interchanged. Therewith, the product term line PT2 is first sensitized and, with the following clock pulses up to and including the clock pulse 17, the product term lines PT2, PT4, etc, are then sensitized.

In this first method step, therefore, m bit patterns are successively obtained at the outputs A1–Ap, these respectively specifying at which locations of the individual m product term lines in the OR plane 2 transistors, for example, the transistor T12, are located.

A second method step follows which is initiated by a clock pulse 18 of $\emptyset 1$. By so doing, a bit pattern is supplied to the input terminals E1–En which exhibits a logic "1" only for the terminal E1, whereas all other inputs are provided with a logic "0". The clock pulse 19 of $\emptyset 2$ again sensitizes the product term line PT1, so that the output signals at the terminals A1–Ap now depend on the presence or absence of the transistor T1 in the AND plane 1. In the first instance, the product term line lies at a logic "0", so that all output signals are "1"; whereas in the latter instance, the product term line PT1 lies at a logic "1", so that all transistors at the points of intersection of the product term line PT1 and the lines AL1–ALp respectively lead to a logic "0" at the appertaining outputs. All further clock pulses of $\emptyset 2$ up to and including the clock pulse 20 again lead to the step-wise sensitization of all remaining product term lines PT2–PTm, so that, all points of intersection of the lines EL1 and PT2–PTm are successively investigated as to functionability of the switching transistors which are potentially at such intersections. Since the test results are respectively transmitted over the OR plane 2 to the outputs A1–Ap, this plane is also simultaneously tested.

With the occurrence of the next clock pulse 21 of $\emptyset 1$, the bit pattern 0100 . . . 0 is then applied to the inputs E1–En in a further method step, whereby the drive cycle described above for the lines PT1–PTm causes all points of intersection of the line EL2 with the lines PT1–PTm to be successively investigated as to the presence of functional transistors.

In further steps, the points of intersection of the further input lines are then investigated, so that, finally, all transistors, for example, the transistor T1, present in the AND plane 1, have been individually subjected to a function-ability test. The test results are respectively transmitted via the OR plane 2.

The test data evaluator 9 receives the emitted bit patterns, processes the same, and determines whether or not at least one deviation from a reference value exists. This can occur, for example, by means of a signature register which accepts each bit pattern emitted at the terminals A1–Ap, respectively shifts the same by one step, and links the same to the next emitted bit pattern in a prescribed manner. After all bit patterns have been received, a result value, i.e. a signature, is derived from the sum of all processing operations. When this agrees with a prescribed reference value, then the tested PLA is free of defect.

A modification of the method is possible in such a manner that only one product term line, for example, the product term line PT1, is first sensitized and, thereby, all existing bit patterns are successively applied to the terminals E1–En. The sensitization of the product term line PT2 then follows, during which all bit patterns are again successively applied to the terminals E1–En, etc. It is therewith achieved that all points of intersection are successively investigated from left to right in respective individual rows lying below one another.

A significant advantage of the arrangement according to FIG. 1 is that it is achieved, by means of the selection circuit comprising the elements ST1, ST2, etc, STr1, STr2, etc, Mu and T11, T21 . . . Tr1, that the dimensions of the individual stages of the shift register 3 are matched to the grid dimension of the product term lines. By assigning a respective stage, for example, the shift register stage SR1, to two lines, for example, to the product term lines PT1 and PT2, it is possible to match the length of the shift register 3 to the vertical dimension of the OR plane 2.

Figure 3:
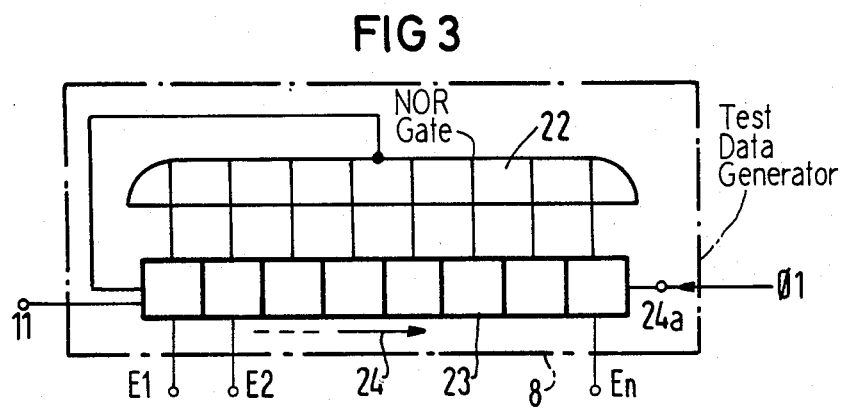
FIG. 3 is a schematic logic diagram of a portion of the circuit of FIG. 1.

FIG. 3 illustrates a preferred exemplary embodiment of the test data generator 8. According to FIG. 3, the test data generator 8 comprises a shift register 23 which is backcoupled from each stage via a NOR gate, the shift direction of the shift register being indicated by an arrow 24. The clock pulses $\emptyset 1$ are applied to an input 24a of the shift register 23.

Figure 4:
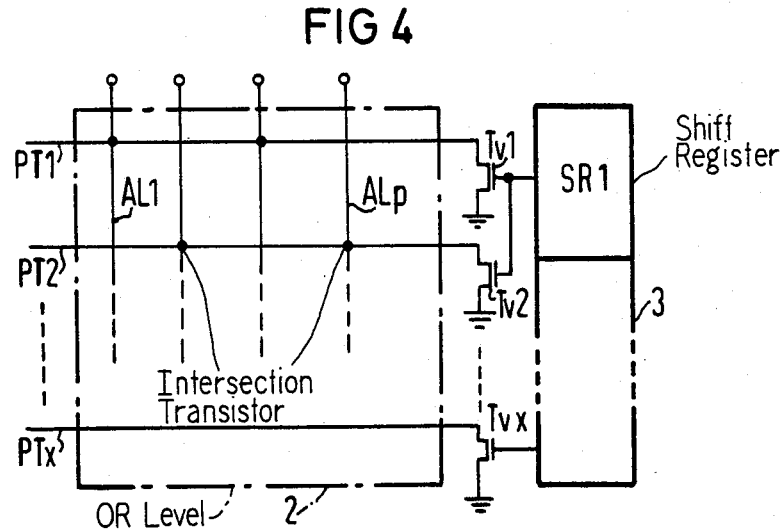
FIG. 4 is a schematic circuit diagram of a further feature of a portion of the circuit of FIG. 1.

Given large PLA arrangements, the product term lines present in a large plurality can be advantageously disposed in such a manner that two respective product term lines lying next to one another exhibit no occupied points of intersection with one and the same output line. FIG. 4 indicates such an embodiment in which the product term lines PT1 and PT2 are simultaneously sensitized by the shift register stage SR1 of the shift register 3 via two transistors Tv1 and Tv2, i.e. given the occurrence of a logic "0" at the output of the shift register stage SR1, are disconnected from ground potential via the transistors Tv1 and Tv2 which are in a blocked condition. All remaining stages of the shift register 3 simultaneously provide a logic "1" at their outputs, so that all remaining product term lines PTx exhibit conductive transistors Tvx in the interim and, therefore, are applied to ground.

Figure 5:
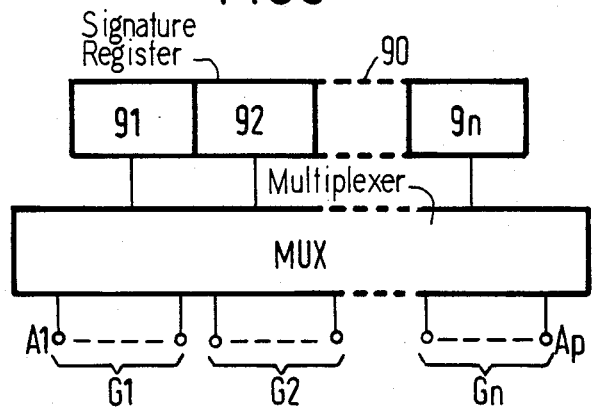
FIG. 5 is a schematic representation of a further development of a different portion of the circuit of FIG. 1.

FIG. 5 illustrates a further feature of the arrangement according to FIG. 1 which comprises a multiplexer MUX which follows the output terminals A1–Ap. When the test data evaluator 9 comprises a n-stage signature register 90, then the outputs A1–Ap can be combined into n groups G1–Gn. The first outputs of all groups are then first connected via the multiplexer MUX to the n stages 91–9n of the signature register 90, subsequently the second outputs of all groups, etc.

Figure 6:
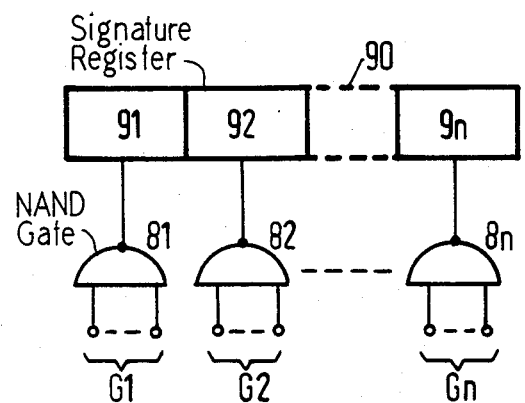
FIG. 6 is a schematic circuit representation of an alternative to the circuit arrangement illustrated in FIG. 5.

Finally, another feature of the invention is illustrated in FIG. 6 in which the aforementioned n groups G1–Gn of the outputs A1–Ap are respectively connected to the inputs of n group-associated NAND gates 81–8n, whose outputs, in turn, are then connected to the inputs of the n stages of the signature register 90. The outputs combined into a group must not be connected to output lines which exhibit occupied points of intersection with one and the same product line.

By employing the multiplexer MUX or the NAND gates 81–8n, the signature register 90 is matched in length to the dimension of the OR plane 2 of the PLA in the direction of the product term lines.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for the function check of a programmable logic array which has output lines, ground lines, input lines, product term lines intersecting the input lines and combined therewith to define an AND plane and intersecting and combined with the output lines to define an OR plane, the product term lines and the output lines having a reference potential applied thereto, and switching transistors at selected intersections of the product term lines and the input and output lines, the switching transistors in the AND plane having a control input connected to a respective input line and a controlled segment connected between the respective term line and a ground line, the switching transistors in the OR plane having a control input connected to the respective product term line and a controlled segment connected to the respective output line and a ground line, the method comprising the steps of:

applying a first logic level to each input line in a first sequence while applying a second logic level to the other input lines;

disconnecting the individual product term lines from ground potential in a second sequence while maintaining ground potential on the other product term lines; and evaluating the bit patterns appearing at the output lines.

2. The method of claim 1, and further comprising the steps of:

first applying the second logic level to each input line;
then sequentially disconnecting the product term lines from ground; and
then evaluating the bit patterns appearing at the output lines.

3. A method for the function check of a programmable logic array which has output lines, ground lines, input lines, product term lines arranged in groups, intersecting the input lines and combined therewith to define an AND plane and intersecting and combined with the output lines to define an OR plane, the product term lines and the output lines having a reference potential applied thereto, and switching transistors at selected intersections of the product term lines and the input and output lines, the switching transistors in the AND plane having a control input connected to a respective input line and a controlled segment connected between the respective product term line and a ground line, the switching transistors in the OR plane having a control input connected to the respective product term line and a controlled segment connected to the respective output line and a ground line, the method comprising the steps of:

applying a first logic level to each input line in a first sequence while applying a second logic level to the other input lines;

disconnecting the individual groups of product term lines from ground potential in a second sequence while maintaining ground potential on the other product term lines; and evaluating the bit patterns appearing at the output lines.

4. The method of claim 3, and further comprising the steps of:

first applying the second logic level to each input line;
then sequentially disconnecting each group of product term lines from ground; and then evaluating the bit patterns appearing at the output lines.

5. Apparatus for performing a function check of a programmable logic array which has output lines, ground lines, input lines, product term lines intersecting the input lines and combined therewith to define an AND plane and intersecting and combined with the output lines to define an OR plane, the product term lines and the output lines having a reference potential applied thereto, and switching transistors at selected intersections of the product term lines and the input and output lines, the switching transistors in the AND plane having a control input connected to a respective input line and a controlled segment connected between the respective product term line and a ground line, the switching transistors in the OR plane having a control input connected to the respective product term line and a controlled segment connected to the respective output line and a ground line, said apparatus comprising:

a test data generator including a plurality of outputs for connection to the input lines and operable to generate a sequence of bit patterns at said outputs;

a plurality of switch elements each for connection to at least one respective product term line; a shift register including a plurality of stages each connected to and operable to control a respective switch element to effect connection and disconnection of the respective product term line with respect to ground;

a clock operable to produce first clock pulses and second clock pulses at a higher frequency than that of said first clock pulses, said clock including a first clock pulse output connected to said test data generator and a second clock pulse output connected to said shift register; and a test data evaluator for connection to the output lines for evaluating the bit patterns which occur in response to the operation of said test data generator and said shift register.

6. The apparatus of claim 5, and further comprising:

a flip-flop connected to and controlled by a stage of said shift register;

an inverter connected to said flip-flop for inverting its output;

a plurality of switching transistors as said switch elements each including a controlled section for connection across a respective pair of product term lines; and a plurality of first control transistors and a plurality of second control transistors, each of said first control transistors including a control input connected to said flip-flop via said inverter and each of said second control transistors including a control input connected directly to said flip-flop, each of said first control transistors including a controlled segment for connection across a first product term line of a respective pair and ground potential, and each of said second control transistors for connection across a second product term line of the respective pair and ground potential.

7. The apparatus of claim 5, wherein said test data generator comprises:

a NOR gate including a plurality of inputs and an output; and a shift register connected to said inputs of said NOR gate and including a plurality of feedback connections via said output of said NOR gate, and a plurality of outputs forming said plurality of outputs of said test data generator.

8. The apparatus of claim 5, wherein each of said switch elements comprises:

a pair of switching transistors each including a control input connected to the respective shift register stage, and a controlled section for connection between a respective product term line and ground potential.

9. The apparatus of claim 5, wherein:

said test data evaluator comprises a signature register.

10. The apparatus of claim 5, wherein the output lines are divided into groups and wherein said test data evaluator comprises:

a multiplexer including a plurality of groups of inputs, each comprising a plurality of inputs, for connection to respective groups of said output lines and a plurality of outputs, and operable to multiplex the groups of inputs to said outputs; and a signature register including a plurality of inputs connected to said plurality of outputs of said multiplexer.

11. The apparatus of claim 5, wherein the output lines are divided into groups and wherein said test data evaluator comprises:

a multi-stage signature register; and a plurality of NAND gates each including an output connected to a respective stage of said signature register and a plurality of inputs for connection to a respective group of said output lines.

* * * * *